United States Patent [19]
Takeda et al.

[11] 3,974,400
[45] Aug. 10, 1976

[54] LIMITER CIRCUIT

[75] Inventors: Masashi Takeda, Isehara; Kenzo Akagiri, Tokyo, both of Japan

[73] Assignee: Sony Corporation, Tokyo, Japan

[22] Filed: Sept. 5, 1975

[21] Appl. No.: 610,862

[30] Foreign Application Priority Data
Sept. 12, 1974 Japan..........................49-110056

[52] U.S. Cl................................ 307/237; 307/264; 328/168; 328/171; 328/175; 330/29; 330/145
[51] Int. Cl.²....................... H03K 5/08; H03K 1/14; H03G 3/30
[58] Field of Search............ 307/237, 264; 328/168, 328/171, 173, 175; 330/29, 145

[56] References Cited
UNITED STATES PATENTS
3,560,768  2/1971  Rimkus.............................. 307/264
3,835,401  9/1974  Tomita et al. .................. 307/237 X

*Primary Examiner*—John Zazworsky
*Attorney, Agent, or Firm*—Lewis H. Eslinger; Alvin Sinderbrand

[57] ABSTRACT

Signal voltage to be limited is applied across a voltage divider comprising a resistor and a controllable impedance element that includes a pair of transistors. The emitter-collector circuit of the transistors is connected in parallel but in opposite polarity, and the output signal voltage is obtained across the controllable impedance element. For limiter operation, a feedback circuit produces a control current based on a signal voltage and applies the control current to the bases of the transistors to control the impedance thereof. When limiter operation is not desired, elements in the feedback circuit are grounded to reduce the controlled current to leakage value. Even the leakage current is prevented from reaching the bases of the transistors by means of a circuit rendered non-conductive in series with the control current circuit. In addition, a bypass path, which is only conductive when limiter operation is not desired, diverts the leakage control current to ground and away from the transistors of the controllable impedance circuit.

13 Claims, 3 Drawing Figures

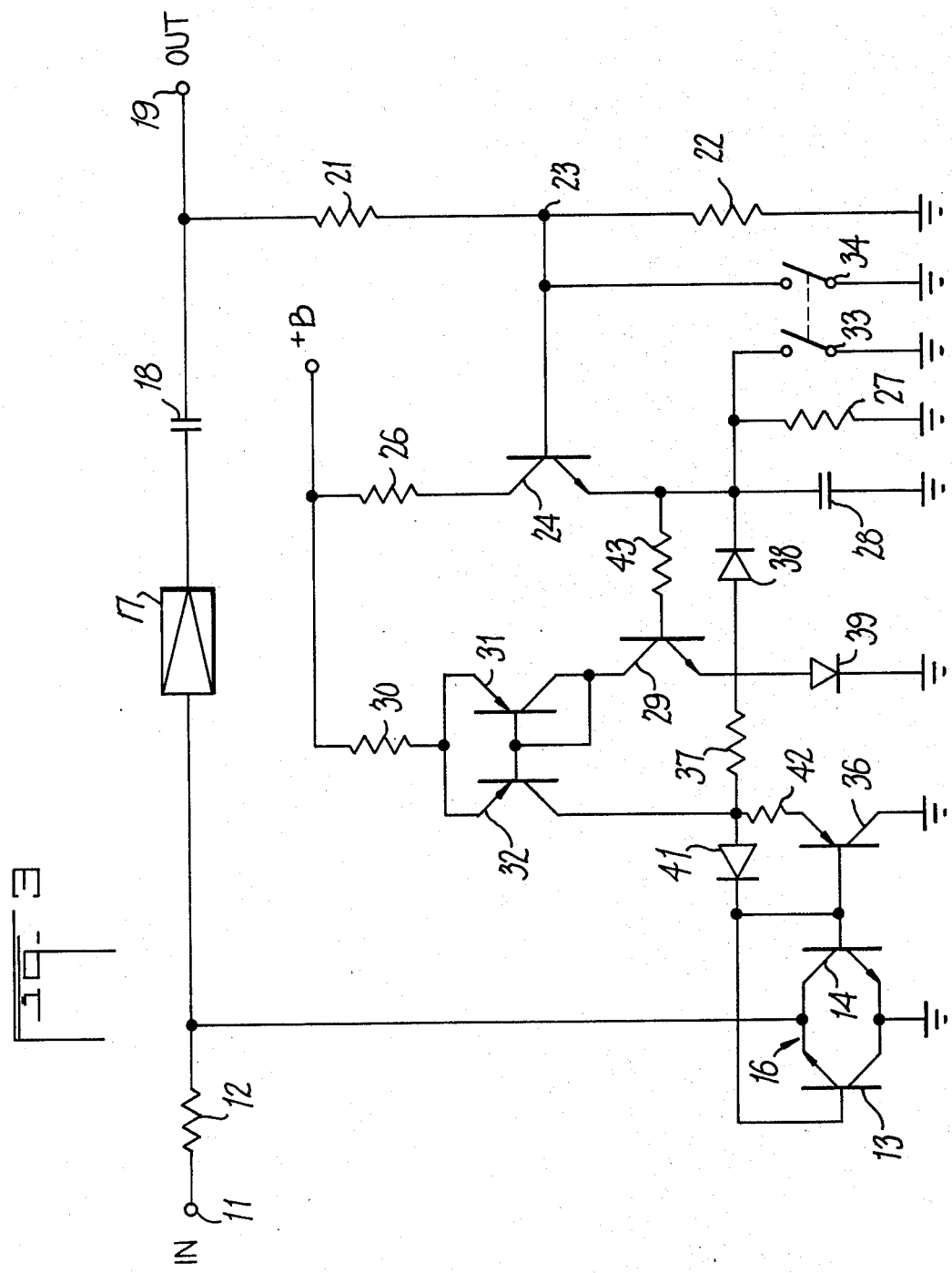

LIMITER CIRCUIT

BACKGROUND OF THE INVENTION

1. Field of the Invention

This invention relates to limiter circuits and particularly to circuits for improving the linearity of operation of linear circuits that include controllable impedance semiconductor means and circuit means to reduce the conductivity of such semiconductor means to a negligible value when limiting action is not desired.

2. The Prior Art

In known limiter circuits, the impedance of a controllable element connected as the shunt element in a voltage divider is controlled in response to a direct voltage signal obtained by rectifying the input voltage signal to be controlled. Typically, the controllable element is a transistor having its emitter-collector circuit connected in series with another impedance to form the voltage divider. The conductivity of the transistor is controlled by a rectified signal that corresponds to the signal applied across the voltage divider.

In the type of circuit just described, the variation in impedance of the transistor is controlled by a voltage signal. This signal corresponds, in general, to the peak value of the input signal that is to be controlled, or at least is related to the peak value. However, the relationship between the base-emitter voltage $V_{be}$ and the collector current $I_c$ of a transistor controlled in this way is not linear over a wide range of control voltages. As a result, the operation of the voltage divider will not be linear and the input signal will be attenuated in a non-linear manner and so will be distorted.

In order to overcome this defect, it has heretofore been proposed to provide a different type of circuit for controlling the impedance of the transistor by means of a controlled signal current from a current source instead of a voltage from a voltage source. The current source includes a second transistor that has its collector-emitter circuit connected between a voltage supply terminal and the base of the transistor to be controlled. The magnitude of the control current that passes through the second transistor is controlled by the rectified output voltage signal supplied to the base of the current source transistor.

Even with the improvement afforded by a current controlled limiter circuit, if the limiter circuit is to be made inoperative by switching means, a leakage current will still flow through the collector-emitter circuit of the current source transistor. The leakage current causes the controlling transistor to be very slightly conductive. The controlling transistor is thus in a transitional condition in which its operation is quite non-linear. As a result, the input signal to be controlled will be badly distorted by operation of the limiter circuit.

SUMMARY OF THE INVENTION

According to the present invention, a limiter circuit is provided that includes a path along which the signal to be controlled is transmitted. The limiter circuit also includes a variable impedance element connected to this signal transmission path to control the transfer of an input signal to the output terminal of the signal path. It further includes a rectifier circuit to generate a direct voltage in response to the magnitude of the signal to be controlled, means to convert the direct voltage to a corresponding current signal, and means to bypass the current signal during times that the linear circuit is to be inoperative, whereby the distortion of the input signal will be greatly reduced when the limiter is to be inoperative.

The invention will be described with reference to the accompanying drawings.

BRIEF DESCRIPTION OF THE DRAWINGS

FIG. 3 is a schematic circuit diagram of another embodiment of a limiter circuit in accordance with the present invention.

DESCRIPTION OF THE PREFERRED EMBODIMENTS

Figure 1:
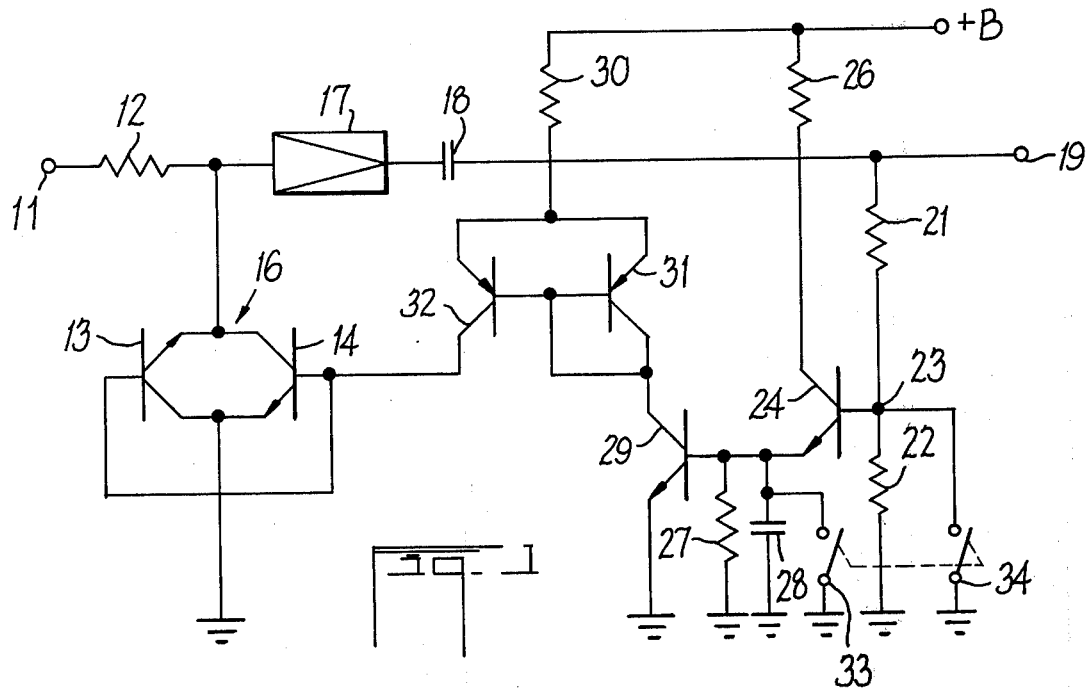
FIG. 1 is a schematic circuit diagram of a basic limiter circuit.

FIG. 1 shows a basic limiter circuit that has an input terminal 11 to which a signal to be limited is applied. The terminal 11 is connected to a voltage divider that comprises a resistor 12 and two oppositely connected transistors 13 and 14 which may be collectively referred to as a controllable impedance element 16. The term "oppositely connected" refers to the fact that the emitter of the transistor 13 is connected to the collector of the transistor 14 and the emitter of the transistor 14 is connected to the collector of the transistor 13. The bases of the transistors 13 and 14 are directly connected together, and the emitter-collector circuits of the transistors 13 and 14 are connected in series between the resistor 12 and a reference voltage terminal, which, in this case, is ground.

The common connection point between the resistor 12 and the transistors 13 and 14 is connected to an amplifier 17. The output of the amplifier is connected through a capacitor 18 to an output terminal 19. Another voltage divider comprising a pair of resistors 21 and 22 is connected across the output circuit of the limiter between the output terminal 19 and ground. A common connection point 23 between the resistors 21 and 22 is connected to the base of a rectifying transistor 24, the collector of which is connected through a resistor 26 to the power supply terminal +B. The emitter of the transistor 24 is connected to one end of a parallel circuit that comprises a resistor 27 and a capacitor 28. The other terminals of this parallel circuit is connected to ground, and the purpose of this parallel circuit is to smooth the signal voltage rectified by the transistor 24.

The emitter of the transistor 24 is also connected to the base of a transistor 29, the emitter of which is connected to the ground. The collector of the transistor 29 is connected through a diode-connected transistor 31 in series with a current limiting resistor 30 to the power supply terminal +B. The transistor 31 is of the opposite conductivity type from the transistors mentioned heretofore. In this embodiment the transistor 31 is a PNP transistor and the other transistors 13, 14, 24 and 29 are NPN transistors.

The emitter of another PNP transistor 32 is connected directly to the emitter of the transistor 31 and the base of the transistor 32 is connected directly to the base of the transistor 31 so that the same base-emitter voltage $V_{be}$ will be applied to both of the transistors 31 and 32. The collector of the transistor 32 is connected directly to the bases of the transistors 13 and 14. By virtue of the parallel connection between the base-emitter circuits of the transistors 31 and 32, these transistors constitute a current source that generates a direct current corresponding to the rectified direct voltage supplied to the base of the transistor 29.

The limiter circuit also has a pair of ganged switches 33 and 34 which are open, as shown, when the limiter circuit is to be operative and which are closed when the limiter circuit is to be inoperative. The switch 33 is connected directly across the parallel circuit comprising the resistor 27 and the capacitor 28 and is therefore connected between ground and the emitter of the transistor 24 and base of the transistor 29. The switch 34 is connected between ground and the base of the transistor 24.

The operation of the circuit in FIG. 1 is such that when a signal to be controlled is applied to the input terminal 11 or, more correctly, in series between that terminal and ground, a fraction of the input voltage is applied to the amplifier 17, depending upon the attenuation due to the voltage divider that comprises the resistor 13 and the variable impedance element 16. The output signal of the amplifier 17 at the terminal 19 may, for example, be applied to a magnetic recording head to be recorded on tape.

The attenuated and amplified output signal between the output terminal 19 and ground is also divided by the second voltage divider that comprises the resistors 21 and 22, and the divided value of this voltage is applied to the base of the transistor 24 to rectify the divided signal. The transistor 24 is conductive only during the positive part of each cycle of the applied signal so that charging current flows through the collector-emitter circuit of the transistor 24 to charge the capacitor 28 only during such positive parts of each cycle. The direct voltage across the capacitor 28 is related to the mean value of the positive portion of each cycle of the applied signal. The resistor 27 at least partially discharges the capacitor 28 during the negative portion of each cycle of the applied signal. The result is a relatively smooth signal voltage at the base of the transistor 29. Generally, the charging and discharging time constants of the limiter circuit are selected to be shorter than those of the usual automatic gain control circuit.

The voltage signal at the base of the transistor 29 controls the flow of the collector current through that transistor. The collector current through the transistor 29 flows through the diode-connected transistor 31, and the predetermined base-emitter voltage of $V_{be}$ of the transistor 31 is applied directly between the base and emitter of the transistor 32. As a result, the collector current through the latter transistor is equal to the collector current that flows through the transistor 31. The collector current of the transistor 32 constitutes the base current for the transistors 13 and 14 to control the impedance of the controllable impedance element 16 in response to the collector current of the transistor 32.

Since the amplitude of the input signal applied to the amplifier 17 is a fraction of the input signal applied to the input terminal 11 and is determined by the voltage division ratio of the resistor 12 and the controllable impedance element 16, the feedback circuit from the output terminal 19 to the bases of the transistors 13 and 14 controls the impedance of the element 16 to maintain the output signal at the terminal 19 at a predetermined level.

When the switches 33 and 34 are closed to disable the operation of the limiter circuit and allow the input signal at the terminal 11 to reach the amplifier 17 without attenuation, the bases of both the transistors 24 and 29 are directly connected to ground, so that both of these transistors become nonconductive. Theoretically no current should be supplied to the bases of the transistors 13 and 14 under that condition, because the transistors 31 and 32 should also be nonconductive. The impedance of the element 16 should be infinite, thereby causing no attenuation of the input signal before it reaches the amplifier 17.

However, as a matter of fact, there will be a leakage collector current flowing through the transistor 32 even when the switches 33 and 34 are closed. This leakage current makes the transistors 13 and 14 slightly conductive so that the controllable impedance element 16 has an impedance that is large but not infinite. Thus the input signal to the terminal 11 is divided by the voltage divider comprising the resistor 12 and the controllable impedance element 16. However, in this condition of low, or transitional, conductivity of the transistors 13 and 14, the equivalent impedance of their emitter-collector circuits is quite non-linear, so that the signal applied to the input terminal 11 will pass through a non-linear voltage divider and will be distorted.

Figure 2:
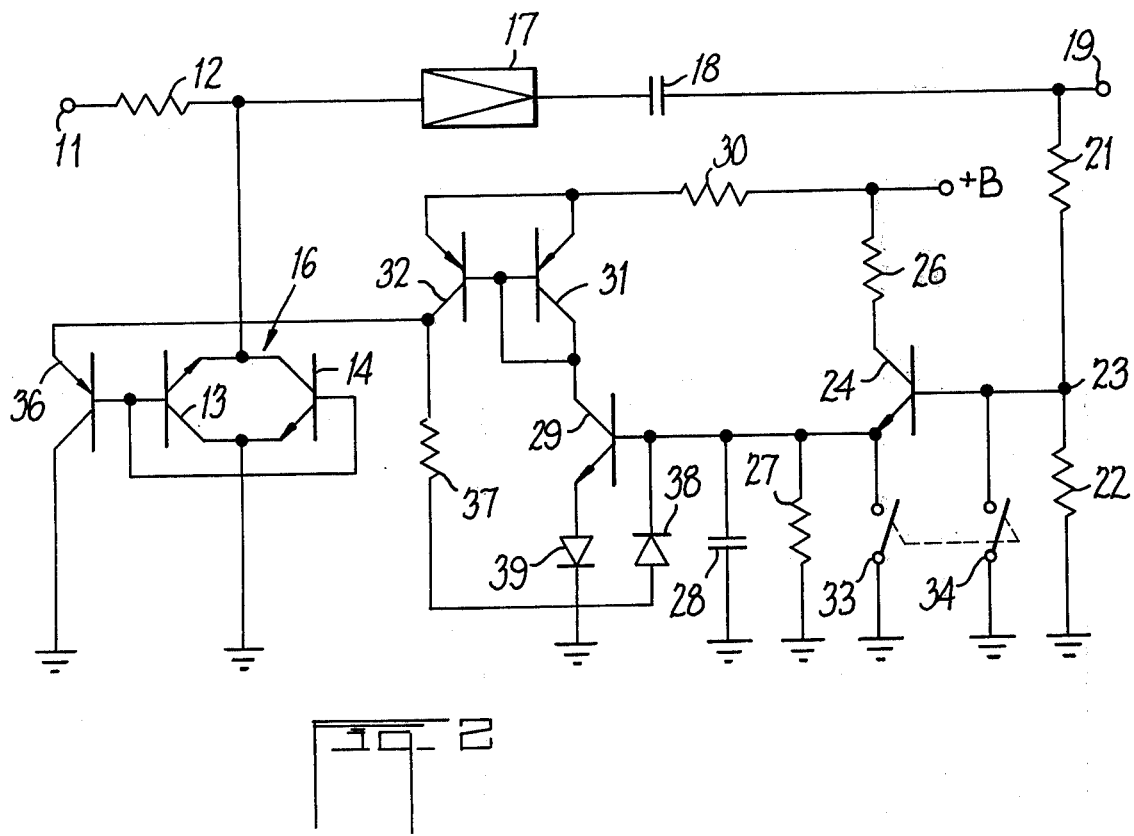
FIG. 2 is a circuit diagram of a limiter circuit in accordance with the present invention.

In order to overcome this defect, an improved circuit is shown in FIG. 2 that includes means for bypassing the leakage current. In FIG. 2 the same reference numerals are used as in FIG. 1 to apply to corresponding circuit elements. Furthermore, the major part of the circuit in FIG. 2 is identical with that in FIG. 1, and neither these circuit connections nor their operation need be described again.

The leakage current bypassing means in FIG. 2 comprises an additional transistor 36 having its emitter connected directly to the collector of the transistor 32 and its collector connected directly to ground. This transistor is also a PNP transistor. Its base is connected directly to the bases of the transistors 13 and 14. The bypassing circuit further includes a resistor 37 connected in series with a diode 38 between the collector of the transistor 32 and the base of the transistor 29. The diode 38 is polarized in the direction of current flow through the emitter-collector circuit of the transistor 32 and is also polarized in the forward direction of current through the base-emitter circuit of transistor 29. A second diode 39 polarized to carry the emitter current of the transistor 29 is connected between the emitter or the transistor 29 and ground.

The operation of the circuit in FIG. 2 when the switches 33 and 34 are open to obtain limiting action is similar to that of the circuit in FIG. 1. The voltage across the diode 39 is approximately equal to $V_{be}$, which is the base-emitter voltage of a transistor, and because of the additional voltage across the diode 39, total voltage between the base of transistor 29 and ground is approximately equal to $2V_{be}$. This is also approximately equal to the voltage at the collector of the transistor 32. Since both ends of the circuit to which the diode 38 are connected are at approximately the same level, the diode 38 in nonconductive and does not interfere with the operation of the limiting circuit.

When the circuit in FIG. 2 is operating as a limiter, the collector current of the transistor 32 flows to ground through the emitter-collector circuit of the transistor 36. As a result, the corresponding base current, the magnitude of which is equal to the control current divided by the $\beta$ of the transistor 36 is applied to the bases of the transistors 13 and 14 to control the impedance of the controllable impedance element 16.

When the switches 33 and 34 are closed to prevent the circuit in FIG. 2 from operating as a limiter circuit, the bases of the transistors 29 and 24 are directly connected to ground. This also means that the cathode of the diode 38 is connected to ground and thus the collector potential of the transistor 32 is approximately equal to $V_{be}$, the voltage drop across the diode 38. In order for the transistor 36 to be conductive, the voltage at its emitter would have to be equal to the voltage between the base and emitter of the transistor 14 plus the voltage between the base and emitter of the transistor 36, or approximately $2V_{be}$. With the diode 38 connected directly to ground through the switch 33, the voltage at the collector of the transistor 32, and therefore at the emitter of the transistor 36 can only be approximately equal to $V_{be}$ and thus the transistor 36 cannot be conductive. Any leakage current that does flow through the transistor 32 cannot flow through the transistor 36 and therefore cannot make the transistors 13 and 14 conductive. Instead, the leakage current that might flow through the transistor 32 has a path to ground through the diode 38. As a result, the signal voltage applied to the input terminal 11 is not divided but reaches the input of the amplifier 17 without change.

Since the current that flows from the collector of the transistor 32 to the bases of the transistors 13 and 14 when the circuit in FIG. 2 is operated as a limiter flow through the PN junction between the emitter and base of the transistor 36, the transistor 36 could be replaced simply by a diode in series between the collector of the transistor 32 and the bases of the transistors 13 and 14.

FIG. 3 shows another embodiment of a limiter circuit according this invention. Many of the components in FIG. 3 are similar to those in FIG. 2 and are identified by the same reference numerals.

FIG. 3 provides a circuit for obtaining temperature-compensation of the transistor 36. A diode 42 is connected between the collector of the transistor 32 and the bases of the transistors 13 and 14 and is polarized to conduct current in the same direction as current flowing through the emitter-collector circuit of the transistor 32. A resistor 42 is connected in series between the collector of the transistor 32 and the emitter of the transistor 36. The only other element in FIG. 3 that does not appear in FIG. 2 is a resistor 43 connected in series between the emitter of the transistor 24 and the base of the transistor 29.

In the operation of the circuit in FIG. 3, only a small amount of current flows through the diode 41. Accordingly, the base potential of the transistor 36 is held at the almost constant value $V_{be}$, regardless of variations in the temperature of the device. Most of the control current to control the operation of the transistors 13 and 14 flows through the resistor 42 and the emitter-base junction of the transistor 36.

When the temperature of the device increases, the control current to the bases of the transistors 13 and 14 would normally increase. However, this current also flows through the resistor 42 and produces a voltage drop across the resistor 42, and this voltage drop therefore increases with the increase in current through the resistor. As a result, the base-emitter voltage of the transistor 36 does not increase in proportion to the increment but is kept substantially constant. By a proper selection of the resistance of the resistor 42 this maintains the current flowing through the base of the transistor 36 substantially constant in spite of variations in temperature.

What is claimed is:
1. A limiter circuit to pass a signal with or without amplitude limiting, selectively, said circuit comprising:
   A. an input circuit section;
   B. an output circuit section;
   C. a controllable impedance element to control the transfer of signal voltage through said limiter circuit from said input circuit section to said output circuit section;
   D. rectifier means for producing a rectified voltage having a magnitude determined by the magnitude of the signal voltage at a circuit point in said limiter circuit between said input circuit section and said output circuit section;
   E. conversion means for converting the rectified voltage to a corresponding current signal;
   F. supply means for supplying said current signal to said controllable impedance element to contol the impedance thereof and thereby control the transfer of signal voltage between said input section and said output section; and
   G. a bypass circuit connected to said supply means to bypass said current signal away from said variable impedance element selectively when the amplitude of the signal voltage at said output circuit section is not to be controlled by said controllable impedance element.

2. The limiter circuit of claim 1 comprising switching means connected to said rectifier means to control the signal voltage to be converted to said current signal.

3. The limiter circuit of claim 2 in which said switching means comprises a switch-connected to the output of said rectifier means to short-circuit the output of said rectifier means, selectively, when said limiter circuit is to pass said signal without amplitude limiting.

4. The limiter circuit according to claim 3 comprising a second switch ganged with said first switch and connected to the input of said rectifier means to connect the input of said rectifier means to a source of fixed potential when the output of said rectifier means is short-circuited.

5. The limiter circuit of claim 1 in which said rectifier means comprises a transistor having a base connected to said circuit point, the rectified signal being produced at the emitter of said transistor.

6. The limiter circuit of claim 1 in which said controllable impedance element comprises first and second transistors having their emitter-collector circuits connected in parallel with each other and in reverse polarity from each other.

7. The limiter circuit of claim 1 in which said bypass circuit comprises a diode connected in series between said supply means and the output of said rectifier means and polarized to conduct current in the same direction as said supply means.

8. The limiter circuit of claim 1 in which said conversion means comprises:
   A. a first transistor connected to the output of said rectifier means;
   B. a diode connected to the collector of said first transistor and in series therewith and polarized to conduct the collector current of said transistor; and
   C. a second transistor having a base-emitter circuit connected in parallel with said diode, the second transistor supplying said current signal to said controllable impedance element.

9. The limiter circuit of claim 8 in which said diode comprises a diode-connected transistor.

10. The limiter circuit of claim 8 in which said bypass circuit comprises:
   A. switching means connected to the base of said first transistor to connect the base of said first transistor to a fixed voltage source terminal selectively when said switching means is actuated; and
   B. aa second diode connected in series between the collector of said second transistor and the base of said first transistor, whereby said switching means carries current passing through said diode when said switching means is actuated.

11. The limiter circuit of claim 10 in which said bypass circuit further comprises:
   A. a PN junction in series with said supply means; and
   B. a third diode connected to the emitter of said first transistor and polarized to carry emitter current of said first transistor.

12. The limiter circuit of claim 11 in which said PN junction is the emitter-base junction of a third transistor.

13. The limiter circuit of claim 12 comprising:
   A. a series connection comprising resistive means connected in series with said emitter-base junction of said third transistor; and
   B. a fourth diode connected in parallel with said series connection.

* * * * *